United States Patent … US 7,466,249 B2
Chen … Date of Patent: Dec. 16, 2008

(54) SYSTEM AND METHOD FOR COMMON MODE CALIBRATION IN AN ANALOG TO DIGITAL CONVERTER

(75) Inventor: Chun-Ying Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/633,544

(22) Filed: Dec. 5, 2006

(65) Prior Publication Data

US 2007/0132625 A1 Jun. 14, 2007

Related U.S. Application Data

(60) Provisional application No. 60/750,064, filed on Dec. 14, 2005.

(51) Int. Cl.
*H03M 1/06* (2006.01)
(52) U.S. Cl. ..................... 341/118; 341/155
(58) Field of Classification Search ............... 341/120, 341/118, 155, 144, 143
See application file for complete search history.

(56) References Cited

U.S. PATENT DOCUMENTS

| 3,651,517 | A | | 3/1972 | Kurek et al. |
|---|---|---|---|---|
| 5,732,276 | A | * | 3/1998 | Komatsu et al. ............ 704/1 |
| 5,818,370 | A | | 10/1998 | Sooch et al. |
| 5,914,638 | A | * | 6/1999 | He ........................... 330/258 |
| 6,348,886 | B1 | | 2/2002 | Frank et al. |
| 6,392,581 | B1 | | 5/2002 | Yang |
| 6,603,416 | B2 | * | 8/2003 | Masenas et al. ........... 341/120 |
| 6,812,777 | B2 | | 11/2004 | Tamura et al. |
| 6,963,237 | B2 | | 11/2005 | Tamura et al. |
| 7,046,179 | B1 | | 5/2006 | Taft et al. |
| 7,102,555 | B2 | | 9/2006 | Collins et al. |
| 7,307,572 | B2 | | 12/2007 | Garrity et al. |
| 2006/0160511 | A1 | * | 7/2006 | Trichy et al. ............. 455/255 |
| 2007/0132617 | A1 | | 6/2007 | Le |
| 2007/0132627 | A1 | | 6/2007 | Chen |
| 2007/0132628 | A1 | | 6/2007 | Chen |
| 2007/0146191 | A1 | | 6/2007 | Iwata et al. |
| 2007/0152863 | A1 | | 7/2007 | Le et al. |
| 2008/0129567 | A1 | | 6/2008 | Lee et al. |

\* cited by examiner

*Primary Examiner*—Peguy JeanPierre
(74) *Attorney, Agent, or Firm*—Sterne, Kessler, Goldstein & Fox P.L.L.C.

(57) ABSTRACT

A conversion circuit increases a gain of an analog-to-digital converter (ADC) preamplifier by minimizing a common mode offset voltage between an input signal and a reference signal. The feedback controller circuit calibrates an input common mode voltage to mitigate a common mode offset voltage. Reduction of the common mode offset voltage increases the gain of the ADC preamplifier. In an example, the method is executed during a hold phase of a track-and-hold circuit that transmits the input signal to the ADC.

25 Claims, 16 Drawing Sheets

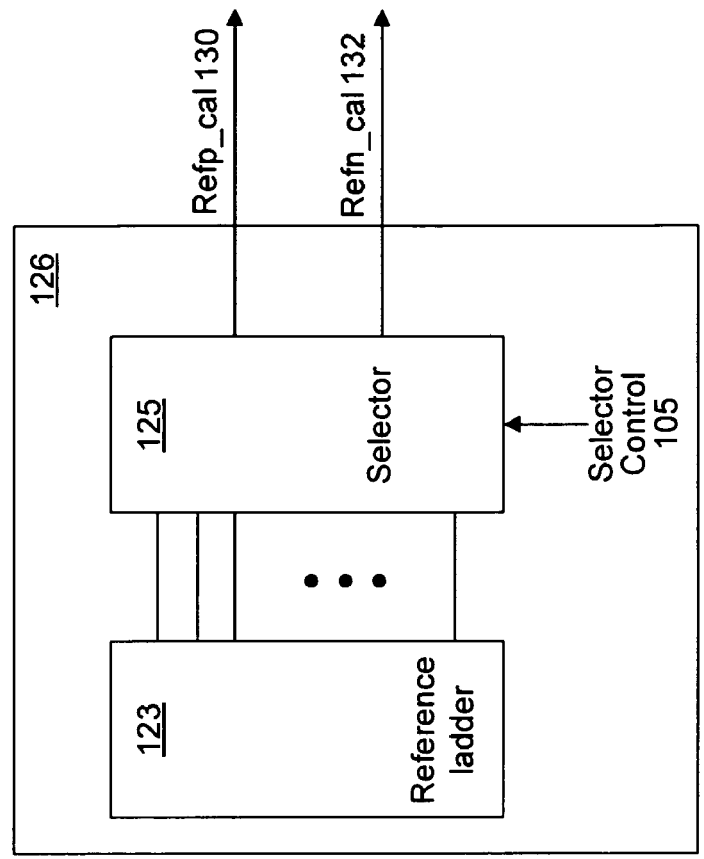
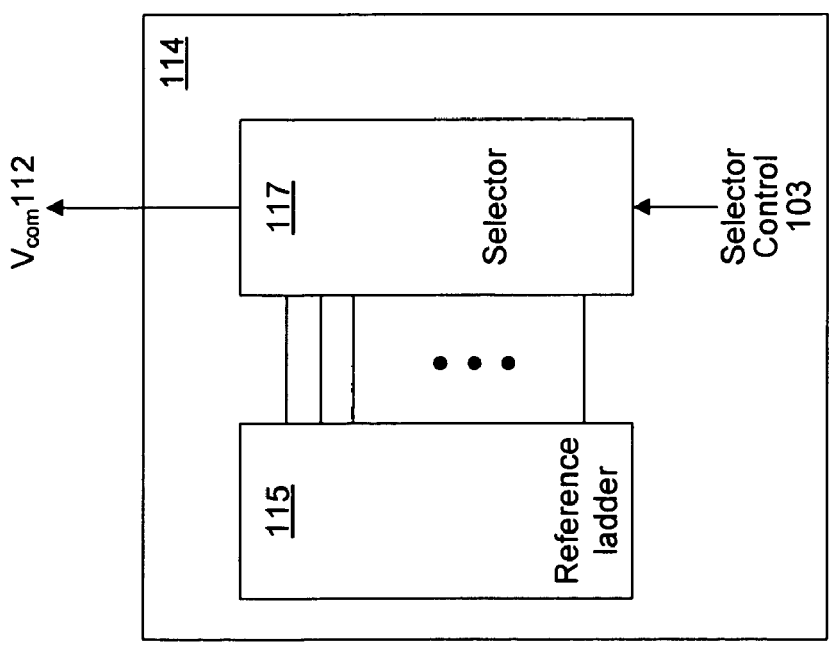
FIG. 1B

ADC Normal Operation

Comparator input = (inp − inn) − (Refp_cal − Refn_cal) = ADC input Difference − Calibration Difference ADC Common Mode Calibration comparator input = (inp − Refp_cal) − (Refn_cal − inn) = (inp + inn) − (Refp_cal + Refn_cal) = (2 • Input Common Mode) − (2 • Calibration Common Mode)

ADC Reference Voltage Calibration comparator input = (Refp − Refn) − (Refp_cal − Refn_cal) − internal ADC offset voltage ADC Reference Voltage Calibration ADC Common Mode Calibration

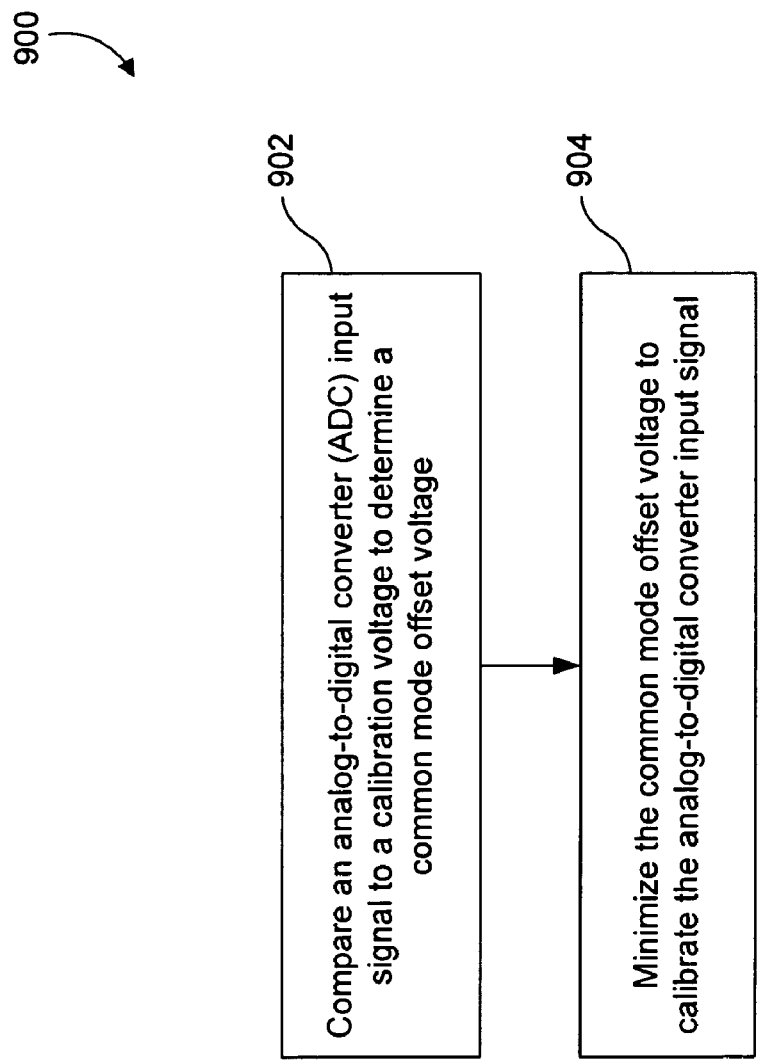

| | Normal Operation | Calibration Operation | |
|---|---|---|---|
| | Normal 1004 | ADC Reference voltage calibration 1008 | ADC Common mode calibration 1010 |
| Mode of conversion circuit 100 | | | |
| Inputs to ADC 116 | inp 118 → i1p 122<br>inn 120 → i1n 124<br>Refp_cal 130 → i2p 134<br>Refn_cal 132 → i2n 136 | Refp 210 → i1p 122<br>Refn 212 → i1n 124<br>Refp_cal 130 → i2p 134<br>Refn_cal 132 → i2n 136 | inp 118 → i1p 122<br>inn 120 → i1n 124<br>Refp_cal 130 → i2p 134<br>Refn_cal 132 → i2n 136 |
| Comparator 140 input | ADC input difference – calibration difference | Reference difference – calibration difference | (2. Input common mode) – (2. calibration common mode) |
| Adjusted Parameter | N/A | Refp_cal 130 and/or Refn_cal 132 to mitigate an ADC offset voltage | Vcom 112 to mitigate common mode offset voltage |

FIG. 10

SYSTEM AND METHOD FOR COMMON MODE CALIBRATION IN AN ANALOG TO DIGITAL CONVERTER

CROSS REFERENCE TO RELATED APPLICATIONS

This application claims the benefit of U.S. Provisional Application No. 60/750,064, filed Dec. 14, 2005, which is incorporated herein by reference in its entirety.

FIELD OF THE INVENTION

The present invention is generally directed to an analog to digital converter (ADC). More particularly, the invention relates to an apparatus and method for calibrating an ADC.

BACKGROUND

In an analog-to-digital converter (ADC), an input voltage having a common mode voltage is input to an ADC input preamplifier. A reference voltage having a common mode voltage is also applied to the ADC input preamplifier. The input preamplifier amplifies a common mode voltage offset between the ADC input voltage and the reference voltage. The common mode voltage of the ADC input voltage does not equal the common mode voltage of the reference voltage, therefore a gain of the ADC input preamplifier decreases. The gain decreases because the differential amplifier is biased at an un-balanced operation point due to the common mode voltage offset. The gain decreases as an offset between the two common mode voltages increases.

One cause of the common mode voltage offset is charge injection in a track and hold circuit coupled to the ADC input preamplifier. The charge injection causes the ADC input voltage to increase during a hold mode of the track and hold circuit. The increase in the ADC input voltage causes the common mode voltage of the ADC input voltage to go up or down. However, there is not a commensurate increase or decrease in the common mode voltage of the reference voltage. Thus, the absolute common mode voltage offset increases. As the absolute common mode voltage offset increases, the input preamplifier gain goes down.

What is needed is an apparatus and method to improve the input preamplifier gain by calibrating the ADC to minimize the common mode voltage offset as well as overcome other shortcomings noted above.

BRIEF SUMMARY

In an embodiment, a method and apparatus is provided to improve a gain of an analog-to-digital converter (ADC) preamplifier. A conversion circuit calibrates the ADC by minimizing a common mode voltage offset between an input voltage and a reference voltage during the hold mode of a track and hold circuit.

The conversion circuit has the following basic structure. The conversion circuit has a reference voltage circuit, a calibration voltage circuit, and a front-end circuit that are coupled to inputs of a switching circuit. A track-and-hold circuit is an example of the front-end circuit. An output of the switching circuit is input to an ADC. The ADC provides an output that is coupled to a feedback controller. Outputs of the feedback controller are coupled to the calibration voltage circuit and a common mode voltage circuit. The common mode voltage circuit output is coupled to the front-end circuit.

The circuits within the conversion circuit generally perform the following functions. The switching circuit selectively couples a pair of inputs to the ADC. An output of the switching circuit is coupled to a first and second ADC input. The ADC compares the differences between the first and second ADC inputs to determine an ADC output. The ADC outputs a "1" or logic high signal if a voltage at the first ADC differential input is higher than a voltage at the second ADC input. The ADC outputs a "0" or logic low signal if the voltage at the first ADC input is lower than the voltage at the second ADC differential input.

The feedback controller circuit has a first integrator coupled to the ADC output.

The first integrator senses the common mode voltage offset between the two inputs to the ADC by measuring a ratio of high to low signals present at the ADC output. The first integrator provides a tri-state output that indicates a ratio greater than one, a substantially equal ratio, and a ratio less than one. A second integrator is coupled to an output of the first integrator. The second integrator processes the tri-state output to produce a control signal indicating increase, hold, or decrease.

The common mode voltage circuit is also coupled to the output of the second integrator. The common mode voltage circuit varies a common mode voltage of the front-end circuit to minimize the common mode voltage offset between an input common mode voltage and the common mode voltage of the calibration voltage. Minimizing the common mode voltage offset improves the gain of the ADC preamplifier and calibrates the ADC.

An exemplary method for improving the gain of the ADC preamplifier is executed during a hold phase of the track-and-hold circuit. The common mode voltage offset is captured in the hold mode for calibration because input data is sampled by the ADC in hold mode. Minimizing the common mode voltage offset in the hold phase can effectively improve ADC preamplifier gain and the ADC's overall performance. The front-end circuit is a track-and-hold circuit in this example. First, the feedback controller circuit senses the ADC output. The feedback controller circuit adjusts the calibration voltage to reduce the calibration offset voltage. Then, the feedback controller circuit calibrates the ADC. Calibration is performed by adjusting the input common mode voltage to minimize the common mode voltage offset. Minimizing the common mode voltage offset increases the gain of the ADC preamplifier.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

In the drawings:

FIG. 1B shows examples of a common mode reference voltage circuit and a calibration voltage circuit;

FIG. 9 illustrates an exemplary timing diagram of a method for minimizing a common mode offset voltage;

FIG. 10 illustrates an exemplary method for increasing an ADC input preamplifier gain.

Figure 1A:
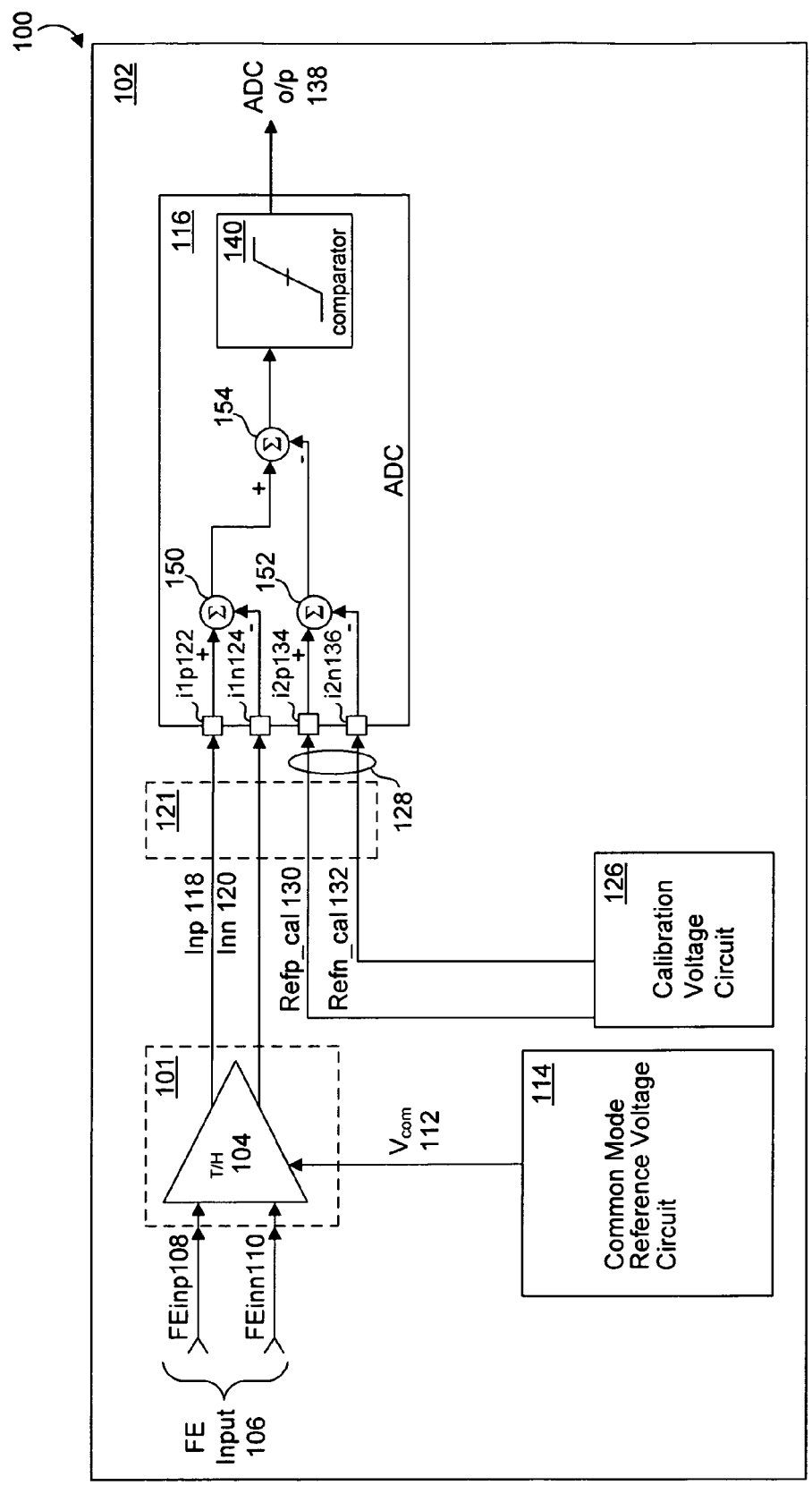
FIG. 1A illustrates an example of a conversion circuit.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Index
I. OVERVIEW
II. CONVERSION CIRCUIT
III. ADC CIRCUIT
IV. ADC NORMAL OPERATION MODE
V. ADC COMMON MODE CALIBRATION MODE
VI. ADC REFERENCE VOLTAGE CALIBRATION MODE
VII. ADC REFERENCE VOLTAGE CALIBRATION CIRCUIT
VIII. ADC COMMON MODE CALIBRATION CIRCUIT
IX. METHOD FOR COMMON MODE CALIBRATION
X. METHOD FOR INCREASING ADC INPUT PREAMPLIFIER GAIN I. Overview As introduced above, various embodiments of the invention involve an apparatus and/or method for common mode calibration in an analog to digital converter. FIGS. 1-10, described below, illustrate this approach.

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

In an embodiment, a method and apparatus is provided to improve a gain of an analog-to-digital converter (ADC) preamplifier. A conversion circuit calibrates the ADC in two modes and operates normally in a third mode. In a first mode, referred to herein as a reference voltage calibration mode, the conversion circuit mitigates an internal ADC offset voltage. In a second mode, referred to herein as an ADC common mode voltage offset mode, the conversion circuit mitigates a common mode offset voltage between an input voltage and the reference voltage. Mitigating the common mode offset voltage improves the gain of the ADC preamplifier. The ADC then provides analog-to-digital conversion in a normal operation mode.

A common mode voltage is an average voltage of a differential voltage. For example, the differential voltage has a first voltage relative to ground. The differential voltage also has a second voltage relative to the ground. The common mode voltage is the average voltage of the first voltage and the second voltage. The common mode voltage offset is a difference between two common mode voltages from two differential signals. For example, in the ADC, the first differential signal is the input data and the second differential signal is the reference voltage The circuits within the conversion circuit generally perform the following functions. The switching circuit selectively couples a pair of inputs to the ADC. An output of the switching circuit is coupled to a first and second ADC input. The ADC compares the differences between the first and second ADC inputs to determine an ADC output. The ADC outputs a "1" or logic high signal if a voltage at the first ADC input is higher than a voltage at the second ADC input. The ADC outputs a "0" or logic low signal if the voltage at the first ADC input is lower than the voltage at the second ADC input.

The feedback controller circuit has a first integrator coupled to the ADC output. The first integrator senses the common mode voltage offset between the two inputs to the ADC by measuring a ratio of high to low signals present at the ADC output. The first integrator provides a tri-state output that indicates a ratio greater than one, a substantially equal ratio, and a ratio less than one. A second integrator is coupled to an output of the first integrator. The second integrator processes the tri-state output to produce a control signal indicating increase, hold, or decrease. The feedback controller may be a low pass filter.

The calibration voltage circuit is coupled to the output of the feedback controller circuit. The calibration voltage circuit produces a variable calibration voltage that is increased, held constant, or decreased based upon the control signal. The calibration voltage circuit output is input to the switching circuit. The differential voltage of the calibration voltage is adjusted by the feedback controller circuit during the reference voltage calibration mode to minimize an ADC internal offset voltage.

The common mode voltage circuit is also coupled to the output of the feedback controller circuit. The common mode voltage circuit varies a common mode voltage of the front-end circuit during the ADC common mode voltage offset mode. The common mode voltage of the front-end circuit is varied to minimize the common mode voltage offset between an input common mode voltage and the common mode voltage of the calibration voltage. Minimizing the common mode voltage offset improves the gain of the ADC preamplifier and calibrates the ADC.

II. Conversion Circuit

FIG. 1A illustrates an exemplary conversion circuit 100. FIG. 1A shows circuits used during a normal operation mode. During the normal operation mode, the ADC provides analog-to-digital conversion. Structure of the conversion circuit 100 is as follows. The conversion circuit 100 has a front-end circuit (FE) 101 with a differential input, front-end input 106. The front-end circuit 101 is a track and hold circuit (T/H) 104. The front-end input 106 has a front-end positive input, FEinp 108 and a front-end negative input FEinn 110. The front-end circuit 101 also has an input, Vcom 112, to adjust a common mode voltage of an output of the front-end circuit 101. The Vcom 112 is coupled to a common mode reference voltage circuit 114. The common mode reference voltage circuit 114 is a variable voltage source. In an example shown in FIG. 1B, the common mode reference voltage circuit 114 has a reference ladder voltage divider 115 coupled to a selector 117. The selector 117 is at least one multiplexer. The selector 117 is controlled by a selector control 103 that raises, holds constant, or lowers a voltage of the Vcom 112 by selectively coupling taps from the reference ladder voltage divider 115. The front-end circuit 101 is coupled to an ADC 116. For example, the ADC 116 is a one-bit analog to digital converter. The front-end circuit 101 provides a positive input (inp) 118 and a negative input (inn) 120 to a switching circuit 121. In examples, the front-end circuit 101 is a circuit other than the track-and-hold circuit 104. The conversion circuit 100 may be deposited on a substrate 102.

Figure 1C:
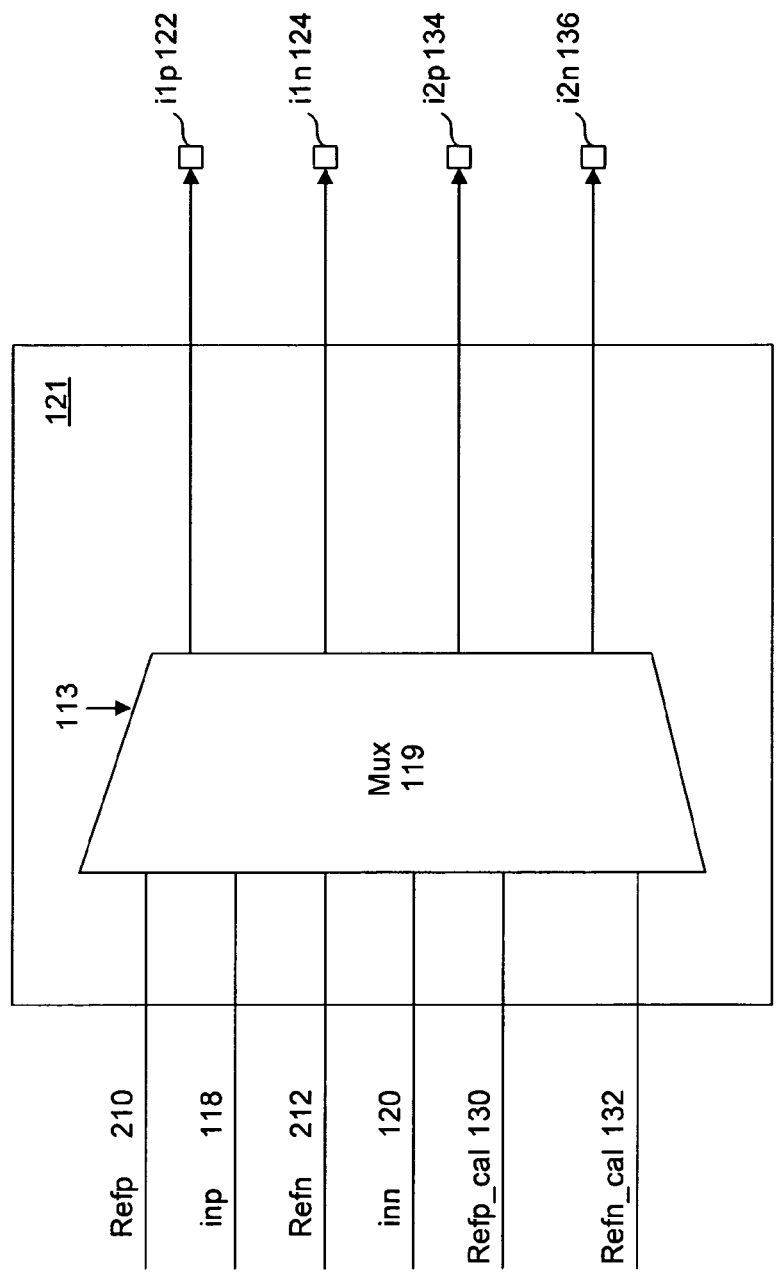
FIG. 1C is an example of a switching circuit.

The ADC 116 has four single-ended inputs. The inputs of the ADC 116 are selected by the switching circuit 121. The switching circuit 121 has at least one multiplexer 119 coupled to the ADC 116 as illustrated in FIG. 1C. A calibration enable input 113 determines which inputs are coupled to the ADC 116.

In the example shown in FIG. 1A, the positive input 118 is coupled to a first ADC input node (i1p) 122. The negative input 120 is coupled to a second ADC input node (i1n) 124. The positive input 118 and the negative input 120 carry the signal to be converted from analog to digital. The ADC 116 is also coupled to a calibration reference voltage circuit 126 via a calibration input 128. The calibration reference voltage circuit 126 is a variable voltage source. In an example shown in FIG. 1B, the calibration reference voltage circuit 126 has a reference ladder voltage divider 123 coupled to a selector 125. The selector 125 is at least one multiplexer. The selector 125 is controlled by a selector control 105. The calibration input 128 has a positive calibration input (Refp_cal) 130 and a negative calibration input (Refn_cal) 132. The Refp_cal 130 is coupled to a third ADC input node (i2p) 134. The Refn_cal 132 is coupled to a fourth ADC input node (i2n) 136. The Refp_cal 130 and Refn_cal 132 provide a signal for comparison with the positive input 118 and the negative input 120 in ADC normal operation.

The ADC 116 has a first subtraction circuit 150 coupled to the first ADC input node (i1p) 122 and the second ADC input node (i1n) 124. The ADC 116 also has a second subtraction circuit 152 coupled to the third ADC input node (i2p) 134 and the fourth ADC input node (i2n) 136. An output of the first subtraction circuit 150 and an output of the second subtraction circuit 152 are coupled to a third subtraction circuit 154. The output of the third subtraction circuit 154 is coupled to a comparator 140. A comparator output provides the ADC output (ADC o/p) 138.

As illustrated in FIG. 1A, the conversion circuit 100 operates as follows. The track-and-hold circuit 104 performs tracking and holding on the FE input 106 to create the positive input (inp) 118 and the negative input (inn) 120. The track-and-hold circuit 104 has a track mode and a hold mode. During the track mode, the track-and-hold circuit 104 tracks a differential signal at the FE input 106 to produce the positive input (inp) 118 and the negative input (inn) 120. The amplitude of a differential output of the track-and-hold circuit 104 substantially equals the differential input signal at the FE input 106 during the track mode, but the common mode voltage of the output of the track-and-hold circuit 104 is set by the Vcom 112. During the hold mode, the track-and-hold circuit 104 holds the positive input (inp) 118 and the negative input (inn) 120 at a constant differential voltage equal to that of the differential signal present at the FE input 106 at the moment the hold mode started. The track-and-hold circuit output, and thus the positive input (inp) 118 and the negative input (inn) 120, have a common mode voltage determined by the Vcom 112 and the charge injection when the track and hold switch turns off. The Vcom 112 is determined by the common mode reference voltage circuit 114.

In the normal mode of operation, the ADC 116 compares the differential signals of the positive input (inp) 118 and the negative input (inn) 120 with the differential calibration reference input 128 to create the digital ADC output 138. The ADC 116 subtracts the negative input 120 from the positive input 118 to create a first differential result. The ADC also subtracts the negative calibration input 132 from the positive calibration input 130 to create a second differential result. The ADC 116 then subtracts the second differential result from the first differential result to create a third differential result. The third differential result is input to the comparator 140. The third differential result is compared to a comparator reference voltage. The comparator reference voltage is zero. In examples, the comparator reference voltage is a voltage other than zero. If the third differential result is positive relative to the comparator reference voltage, then the ADC output 138 is a logic "high" and/or a digital "1". If the third differential result is negative relative to the comparator reference voltage, then the ADC output 138 is a logic "low" and/or a digital "−1". The comparator output is the ADC output 138.

III. ADC Circuit

The positive input (inp) 118 and the negative input (inp) 120 are differential outputs of a track and hold circuit 104. The positive input (inp) 118 and the negative input (inp) 120 are input to a first preamplifier 206. The positive input (inp) 118 and the negative input (inp) 120 have an input common mode voltage. A positive reference input (Refp) 210 and a negative reference input (Refn) 212 are a differential reference voltage derived from a high-accuracy reference voltage generator such as a resistor ladder. The positive reference input (Refp) 210 and the negative reference input (Refn) 212 are input to the first preamplifier 206. The positive calibration input (Refp_cal) 130 and the negative calibration input (Refn_cal) 132 form a calibrated differential reference voltage to compensate the mismatch in the ADC 116 due the device mismatch.

Figure 2:
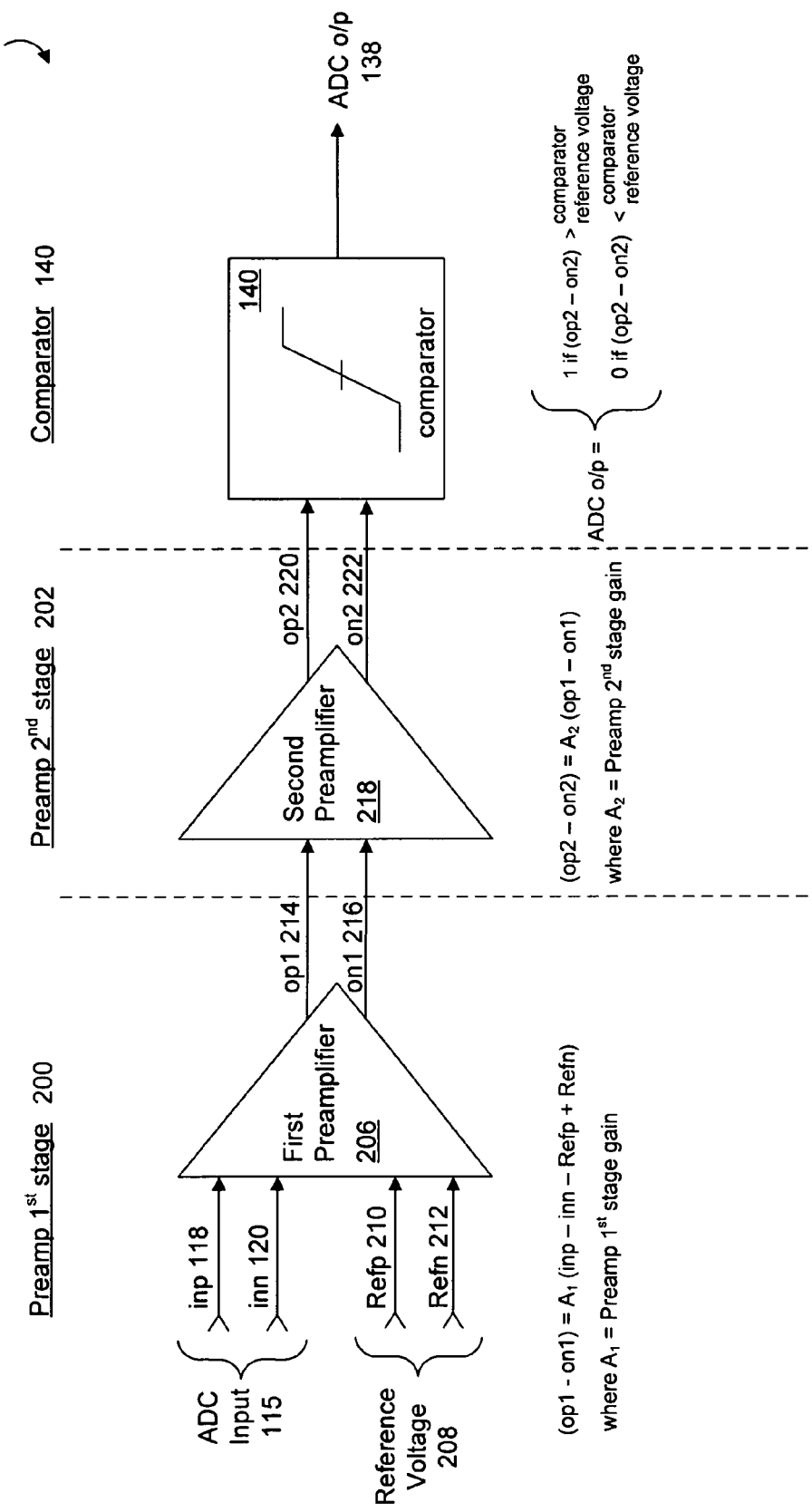
FIG. 2 is an example of a one-bit analog to digital converter.

In an example illustrated in FIG. 2, the ADC 116 is comprised of a preamplifier first stage 200, a preamplifier second stage 202, and the comparator 140. The preamplifier first stage 200 has the first preamplifier 206. The pair of differential signals with positive input (inp) 118 and the negative input (inp) 120 are input to the first preamplifier 206. A differential reference voltage 208 having the positive reference input (Refp) 210 and the negative reference input (Refn)

212 is also input to the first preamplifier 206. In an example, the positive calibration input (Refp_cal) 130 and the negative calibration input (Refn_cal) 132 are coupled to the first preamplifier 206 in place of the positive reference input (Refp) 210 and the negative reference input (Refn) 212. The first preamplifier 206 provides the first differential output which is a first output (op1) 214 and the second differential output which is a second output (on1) 216.

In examples, a second preamplifier 218 is coupled to the first output (op1) 214 and the second output (on1) 216. The second preamplifier 218 provides a second preamplifier differential output having a first output (op2) 220 and a second output (on2) 222. The comparator 140 is coupled to the first output (op2) 220 and the second output (on2) 222. The output of the comparator 140 is coupled to the ADC output 138.

In an embodiment, the ADC circuit 116 functions as follows. The first preamplifier 206 subtracts the negative input 120 from the positive input 118 to create a first differential result. The first preamplifier 206 subtracts the negative reference input (Refn) 212 from the positive reference input (Refp) 210 to create a second differential result. The first and second differential results are then amplified to produce the first output (op1) 214 and the second output (on1) 216. The preamplifier first stage 200 output is determined by the equation: $(op1-on2)=A_1 \cdot (inp-inn-Refp+Refn)$ where $A_1$ is the first preamplifier 206 gain.

The preamplifier second stage 202 amplifies the preamplifier first stage 200 output to produce the first output (op2) 220 and the second output (on2) 222. The preamplifier second stage 202 output is determined by the equation: $(op2-on2)=A_2 \cdot (op1-on1)$ where $A_2$ is the second preamplifier 218 gain.

The comparator 140 input is the first output (op2) 220 and the second output (on2) 222 of the preamplifier second stage 202. The comparator 140 subtracts the second output (on2) from the first output (op2) 220 to create a third differential result. The third differential result is compared to a comparator reference voltage. The comparator reference voltage is zero volts. In examples, the comparator reference voltage is a voltage having a magnitude other than zero volts. If the third differential result is positive relative to the comparator reference voltage, then the comparator output is a logic "high" and/or a digital "1". If the third differential result is negative relative to the comparator reference voltage, then the comparator output is a logic "low" and/or a digital "−1".

IV. ADC Normal Operation Mode

Figure 3:
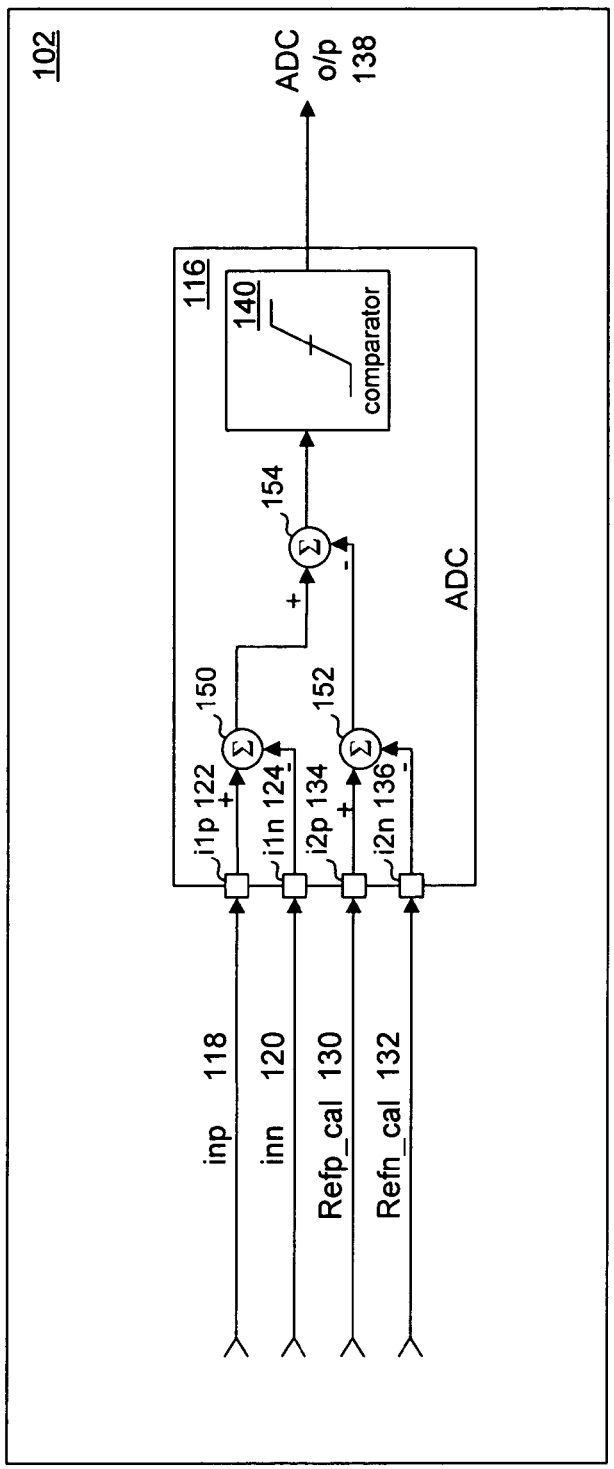
FIG. 3 is an example of analog to digital converter (ADC) inputs and outputs during normal operation.

FIG. 3 shows an exemplary configuration of the ADC 116 during the normal operation mode. During the normal operation mode, the ADC provides analog-to-digital conversion. The ADC 116 has four inputs coupled by the switching circuit 121. The positive input (inp) 118 is coupled to the first ADC input node (i1p) 122. The negative input (inn) 120 is coupled to the second ADC input node (i1n) 124. The positive input 118 and the negative input 120 carry the signal to be converted from analog to digital. The positive reference input (Refp_cal) 130 is coupled to the third ADC input node (i2p) 134. The negative reference input (Refn_cal) 132 is coupled to the fourth ADC input node (i2n) 136.

The ADC 116 subtracts the negative input (inn) 120 from the positive input (inp) 118 to create a first differential result. The ADC 116 also subtracts the negative calibration input (Refn_cal) 132 from the positive calibration input (Refp_cal) 130 to create a second differential result. Then the ADC 116 subtracts the second differential result from the first differential result to create a third differential result. Thus, the third differential result is determined by the equation: (inp−inn)−(Refp_cal−Refn_cal)=ADC input difference−calibration reference difference. The third differential result is input to the comparator 140. The comparator 140 compares the third differential result to a comparator reference voltage. The comparator reference voltage is zero volts. In examples, the comparator reference voltage is a voltage other than zero volts. If the third differential result is positive relative to the comparator reference voltage, then the comparator output is a logic "high" and/or a digital "1". If the third differential result is negative relative to the comparator reference voltage, then the output is a logic "low" and/or a digital "−1". The comparator output is coupled to the ADC output 138.

V. ADC Common Mode Calibration Mode

Figure 4A:
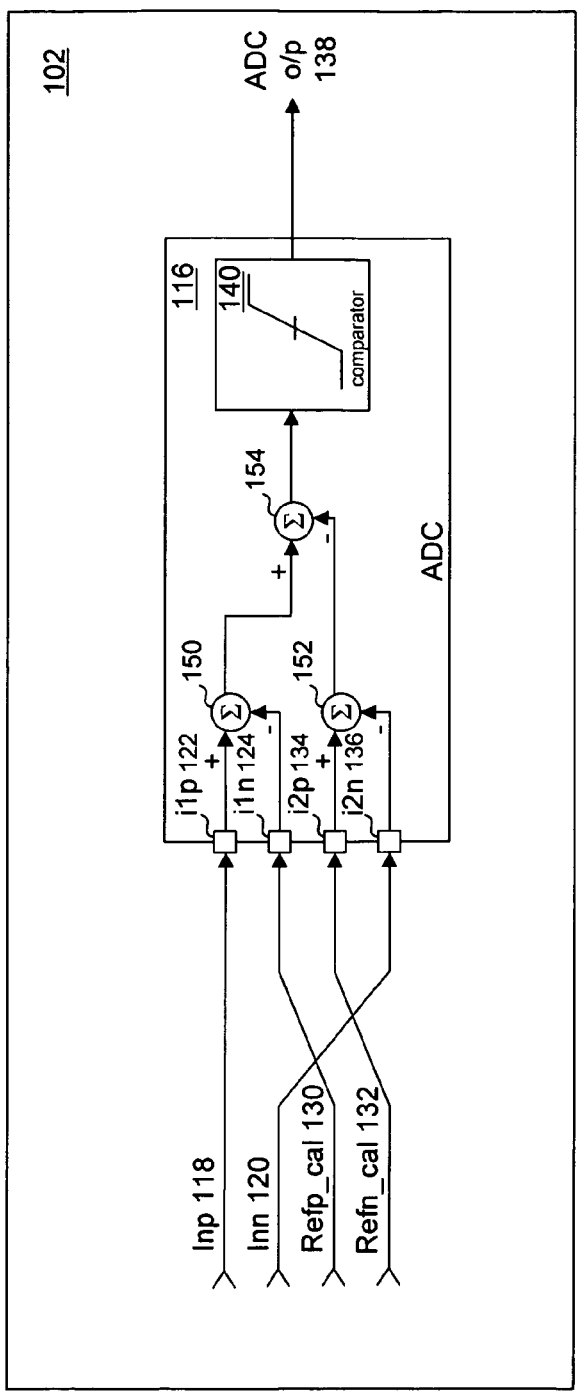
FIG. 4A is an example of ADC inputs and outputs during common mode calibration.

FIG. 4A shows an exemplary configuration of the ADC 116 during common mode calibration mode. The ADC 116 has four inputs coupled by the switching circuit 121. The positive input (inp) 118 is coupled to the first ADC input node (i1p) 122. The negative input (inn) 120 is coupled to the fourth ADC input node (i2n) 136. The positive calibration input (Refp_cal) 130 is coupled to the second ADC input node (i1n) 124. The negative calibration input (Refn_cal) 132 is coupled to the third ADC input node (i2p) 134.

The ADC 116 subtracts the positive calibration input (Refp_cal) 130 from the positive input (inp) 118 to create a first differential result. The ADC 116 subtracts the negative input (inn) 130 from the negative calibration input (Refn_cal) 132 to create a second differential result. The ADC 116 then subtracts the second differential result from the first differential result to create a third differential result. The third differential result is determined by the equation: (inp−Refp_cal)−(Refn_cal−inn)=(inp+inn)−(Refp_cal+Refn_cal+Refn_cal)=(2·input common mode)−(2·calibration common mode). The third differential result is input to the comparator 140. The third differential result is compared to the comparator reference voltage. The comparator reference voltage is zero. In examples, the comparator reference voltage is a voltage other than zero. If the third differential result is positive relative to the comparator reference voltage, then the comparator output is a logic "high" and/or a digital "1". If the third differential result is negative relative to the comparator reference voltage, then the output is a logic "low" and/or a digital "−1". The comparator output is coupled to the ADC output 138.

VI. ADC Reference Voltage Calibration Mode

Figure 4B:
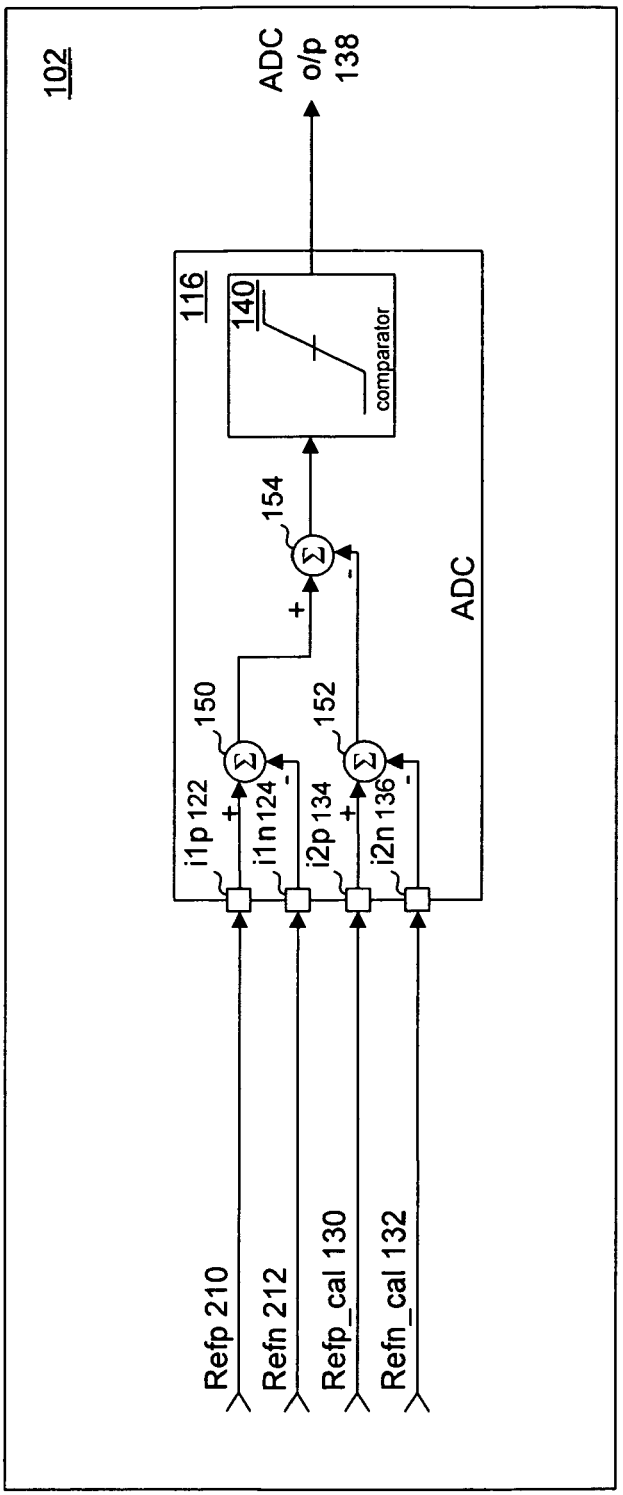
FIG. 4B is an example of ADC inputs and outputs during reference voltage calibration.

FIG. 4B shows an exemplary configuration of the ADC 116 during reference voltage calibration mode. The ADC 116 has four inputs coupled by the switching circuit 121. The positive reference input (Refp) 210 is coupled to the first ADC input node (i1p) 122. The negative reference input (Refn) 212 is coupled to the second ADC input node (i1n) 124. The positive calibration input (Refp_cal) 130 is coupled to the third ADC input node (i2p) 134. The negative calibration input (Refn_cal) 132 is coupled to the fourth ADC input node (i2n) 136.

The ADC 116 subtracts the negative reference input (Refn) 212 from the positive reference input (Refp) 210 to create a first differential result. The ADC 116 also subtracts the negative calibration input (Refn_cal) 132 from the positive calibration input (Refp_cal) 130 to create a second differential result. Then ADC 116 subtracts the second differential result from the first differential result to create a third differential result. The third differential result is determined by the equation: (Refp−−Refn)−(Refp_cal−Refn_cal)—an internal offset voltage of the ADC 116. The third differential result is input to the comparator 140. The third differential result is compared to the comparator reference voltage. The comparator reference voltage is zero. In examples, the comparator reference voltage is a voltage other than zero. If the third differential result is positive relative to the comparator reference voltage, then the comparator output is a logic "high" and/or a digital "1". If the third differential result is negative relative to the comparator reference voltage, then the output is a logic "low" and/or a digital "−1". The comparator output is coupled to the ADC output 138.

VII. ADC Reference Voltage Calibration Circuit

Figure 5A:
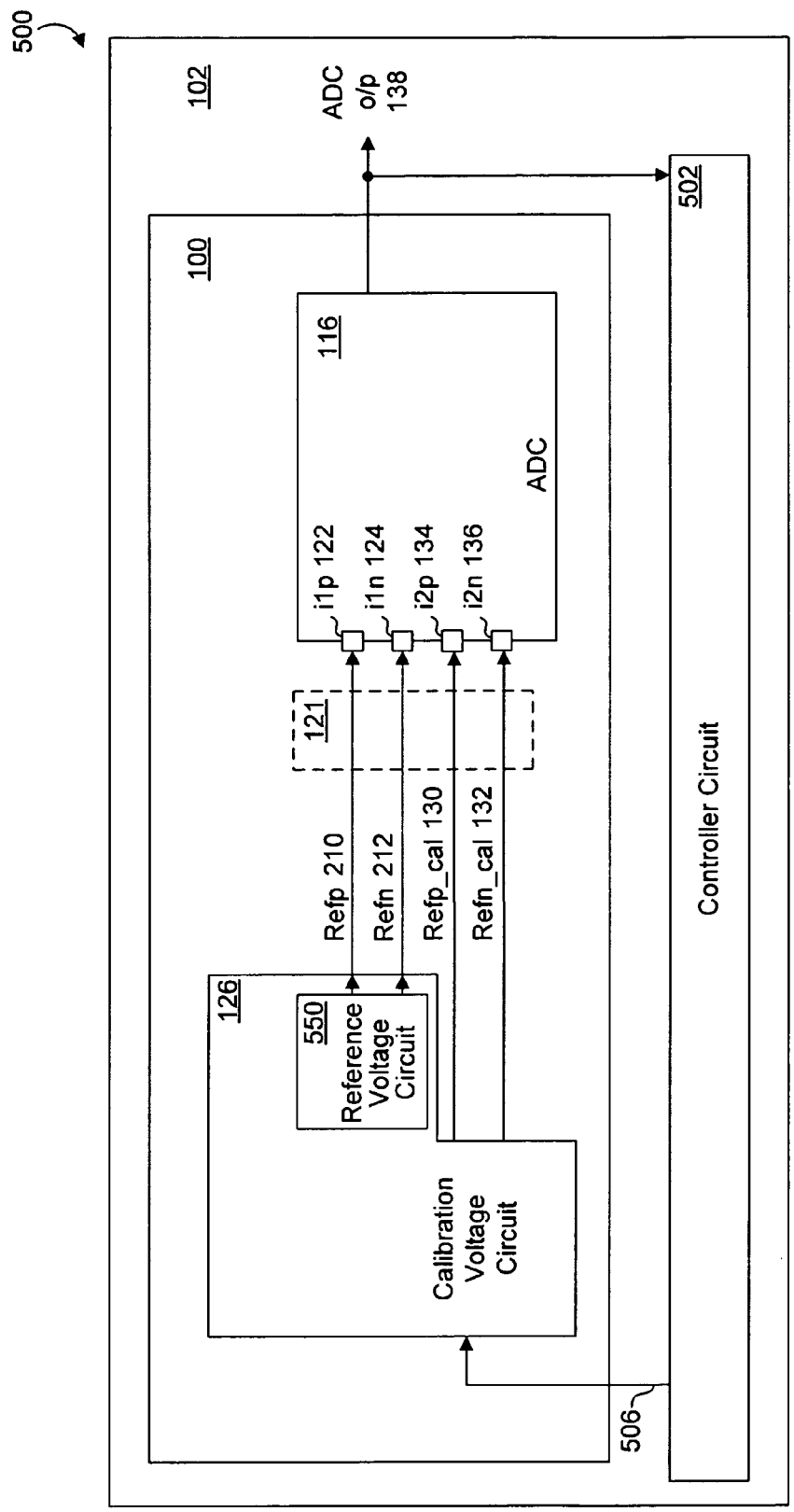
FIG. 5A is an example of a converter reference voltage calibration circuit.

FIG. 5A illustrates an exemplary ADC reference voltage calibration circuit 500. The ADC 116 and a feedback controller circuit 502 are deposited on the common substrate 102. The ADC output 138 is coupled to an input of the feedback controller circuit 502. A controller circuit output 506 of the feedback controller circuit 502 is coupled to the calibration reference voltage circuit 126. Two outputs of the calibration reference voltage circuit 126 are the positive calibration input (Refp_cal) 130 and the negative calibration input (Refn_cal) 132. The positive reference input (Refp) 210 and the negative reference input (Refn) 212 are supplied by a reference voltage circuit 550. The reference voltage circuit 550 is part of the calibration circuit 126. The reference voltage circuit 550 may be independent of the calibration circuit 126. In examples, the positive calibration input (Refp_cal) 130 and/or the negative calibration input (Refn_cal) 132 are created by the controller circuit 502 and coupled directly between the controller circuit 502 and the switching circuit 121.

The ADC 116 has four inputs coupled by the switching circuit 121. The positive reference input (Refp) 210 is coupled to the first ADC input node (i1p) 122. The negative reference input (Refn) 212 is coupled to the second ADC input node (i1n) 124. The positive calibration input (Refp_cal) 130 is coupled to the third ADC input node (i2p) 134. The negative calibration input (Refn_cal) 132 is coupled to the fourth ADC input node (i2n) 136.

The ADC reference voltage calibration circuit 500 adjusts the positive calibration input (Refp_cal) 130 and the negative calibration input (Refn_cal) 132 to compensate for an offset voltage that is internal to the ADC 116. The difference between the positive calibration input (Refp_cal) 130 and the negative calibration input (Refn_cal) 132 is adjusted to substantially equal the ADC offset voltage plus the difference between the positive reference input (Refp) 210 and the negative reference input (Refn) 212.

The ADC output 138 is input to the feedback controller circuit 502. The feedback controller circuit 502 provides a controller circuit output 506 to adjust the calibration reference voltage circuit 126. The controller circuit output 506 to the calibration reference voltage circuit 126 is disabled during ADC common mode calibration mode. The controller circuit output 506 is a function of the ADC output 138. The calibration reference voltage circuit 126 controls the positive calibration input (Refp_cal) 130 and the negative calibration input (Refn_cal) 132. The positive calibration input (Refp_cal) 130 and the negative calibration input (Refn_cal) 132 are adjusted by the feedback controller circuit 502 to compensate for the offset voltage that is internal to the ADC 116.

Figure 5B:
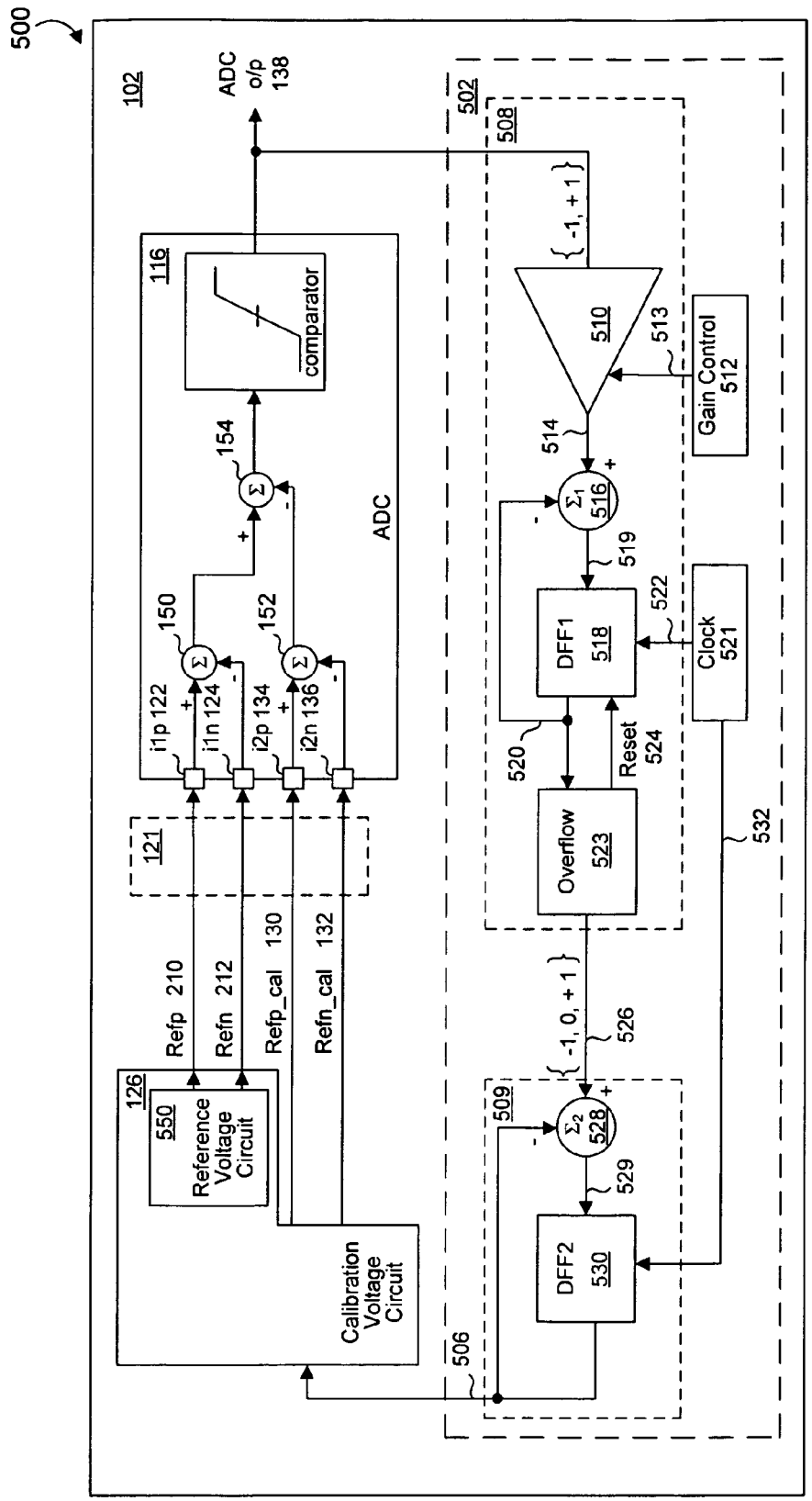
FIG. 5B is an example of a converter reference voltage calibration circuit including a feedback controller circuit.

FIG. 5B illustrates an exemplary ADC reference voltage calibration circuit 500 where the feedback controller circuit 502 has two integrators coupled in series. The ADC output 138 is coupled to the input of an amplifier 510 in a first integrator 508. A gain control circuit 512 is also coupled to an input of the amplifier 510 via a gain control output 513. The amplifier 510 has an amplifier output 514 coupled to an additive input of a first summation circuit 516. The first summation circuit 516 is coupled to a first flip-flop 518 via a first summation output 519. The first summation circuit 516 and the first flip-flop 518 form a digital accumulator. A clock circuit 521 is also coupled to the first flip-flop 518 via a first clock output 522. The first flip-flop 518 has a first flip-flop output 520. The first flip-flop output 520 is coupled to a subtractive input of the first summation circuit 516 to provide a feedback path. The first flip-flop output 520 is coupled to an overflow circuit 523. The overflow circuit 523 has a reset output 524 coupled to the first flip-flop 518. The overflow circuit 523 has an overflow output 526 that is the output of the first integrator 508.

The overflow output 526 is coupled to an additive input of a second summation circuit 528 in a second integrator 509. The second summation circuit 528 is coupled to a second flip-flop 530 via a second summation output 529. The second summation circuit 528 and the second flip-flop 530 form a second stage of the digital accumulator. The clock circuit 521 is also coupled to the second flip-flop 530 via a second clock output 532. The first clock output 522 is identical to the second clock output 532. In examples, the first clock output 522 is different than the second clock output 532. The second flip-flop 530 has a second flip-flop output that is the controller circuit output 506. Thus, the output of the second flip flop 530 is coupled to the calibration reference voltage circuit 126. The output of the second flip flop is also coupled to a subtractive input of the second summation circuit 528 to provide a feedback path.

Operational detail of the feedback controller circuit 502 illustrated in FIG. 5B is as follows. The ADC output 138 has two states. A first state of the ADC output 138 is the logic "high" and/or the digital "1". A second state of the ADC output 138 is the logic "low" and/or the digital "−1". The ADC output 138 is input to the first integrator 508. The first integrator 508 senses the difference between the common mode voltage of the calibration voltage and the common mode voltage of the reference voltage by measuring a ratio of high to low and/or a ratio of "1" to "−1" signals present at the ADC output. The first integrator 508 provides a tri-state output at the overflow output 526 that indicates a ratio greater than one, an equal ratio, and a ratio less than one. A first state that indicates a ratio greater than one is the logic "high" and/or the digital "1". A second state that indicates a ratio less than one is the logic "low" and/or the digital "−1". A third state that indicates an equal ratio is a "neutral" and/or a digital "0" state.

The integrator 508 determines these outputs as follows. First, the ADC output 138 is amplified by the amplifier 510. The gain control 512 varies the gain of the amplifier 510. The first flip-flop output 520 is then subtracted from the amplifier output 514 by the first summation circuit 516 to create the first summation output 519. As a result of the feedback provided by the first flip-flop output 520, the first summation output 519 is an integral of the amplifier output 514. The first summation output 519 is sampled by the first flip-flop 518 with sample timing determined by the first clock output 522. The first clock output is produced by the clock circuit 521. The first flip-flop 518 provides the first flip-flop output 520. The first flip-flop output 520 is input to the overflow circuit 523 which counts a number of logic states in the first flip-flop output 520. When the number of logic states in the first flip-flop output 520 reaches a predetermined number, the overflow circuit 523 issues a reset signal on the reset output 524 to reset the first flip-flop 518. The overflow output 526 is passed to the second integrator 509.

The second flip-flop output is then subtracted from the overflow output 526 by the second summation circuit 528 to create the second summation output 529. As a result of the feedback provided by the second flip-flop output, the second summation output 529 is an integral of the overflow output 526. The second summation output 529 is sampled by the second flip-flop 530 with sample timing determined by the second clock output 532. The second clock output 532 is produced by the clock circuit 521. The second flip-flop 530 provides the second flip-flop output which is also the output of the second integrator 509 and the controller circuit output 506.

The controller circuit output 506 has three states. A first state of the controller circuit output 506 is the logic "high" and/or the digital "1". The first state indicates "increase." The first state occurs when the differential voltage between the positive calibration input (Refp_cal) 130 and the negative calibration input (Refn_cal) 132 is to be increased to compensate for the ADC's internal offset voltage. A second state of the controller circuit output 506 is the logic "low" and/or the digital "−1". The second state indicates "decrease." The second state occurs when the differential voltage between the positive calibration input (Refp_cal) 130 and the negative calibration input (Refn_cal) 132 is to be decreased to compensate for the ADC's internal offset voltage. A third state of the controller circuit output 506 is a "neutral," intermediate, and/or a digital "0" state. The third state indicates "hold" and occurs when differential voltage between the positive calibration input (Refp_cal) 130 and the negative calibration input (Refn_cal) 132 is to be held steady at a substantially constant magnitude. In the third state, the ADC reference voltage calibration circuit 500 has compensated for the ADC's internal offset voltage.

Figure 5C:
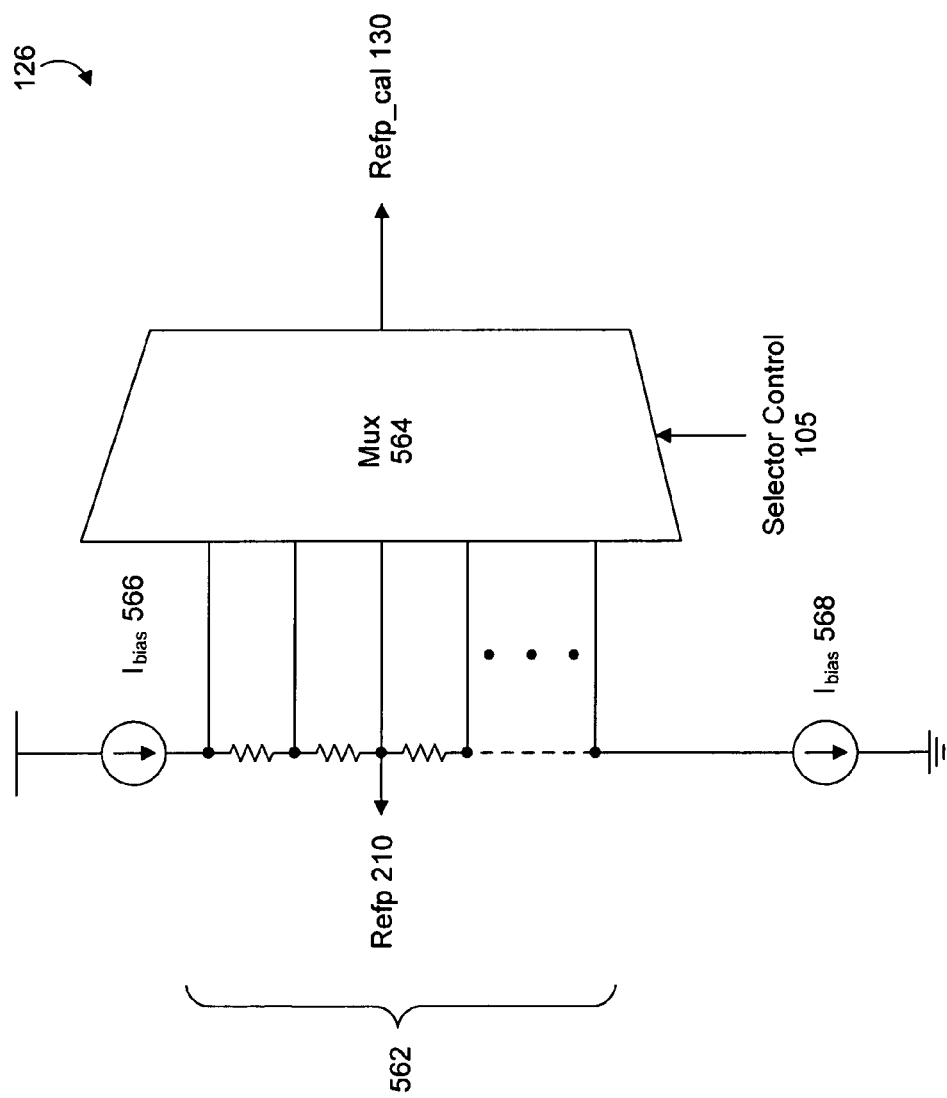
FIG. 5C is an example of a calibration voltage circuit having a reference ladder and multiplexer.

FIG. 5C illustrates a positive voltage supply side of an exemplary calibration reference voltage circuit 126 having a reference ladder 562 and a multiplexer 564. A negative voltage supply side may be identical with reversed polarity and current source direction. The reference ladder 562 is driven by a first current source 566 and a second current source 568. In examples, the reference ladder 562 is driven by at least one current source. Inputs to the multiplexer 564 are coupled to taps on the reference ladder 562 to provide a variety of voltages. The selector control 105 selects at least one tap on the reference ladder 562 to be coupled to an output of the multiplexer 564. The selector control 105 is coupled to the controller circuit output 506. An output of the multiplexer 564 is the positive calibration input (Refp_cal) 130. The positive reference input (Refp) 210 is tapped off of the reference ladder 562. In examples, the positive reference input (Refp) 210 is provided by a variable voltage source.

VIII. ADC Common Mode Calibration Circuit

Figure 6:
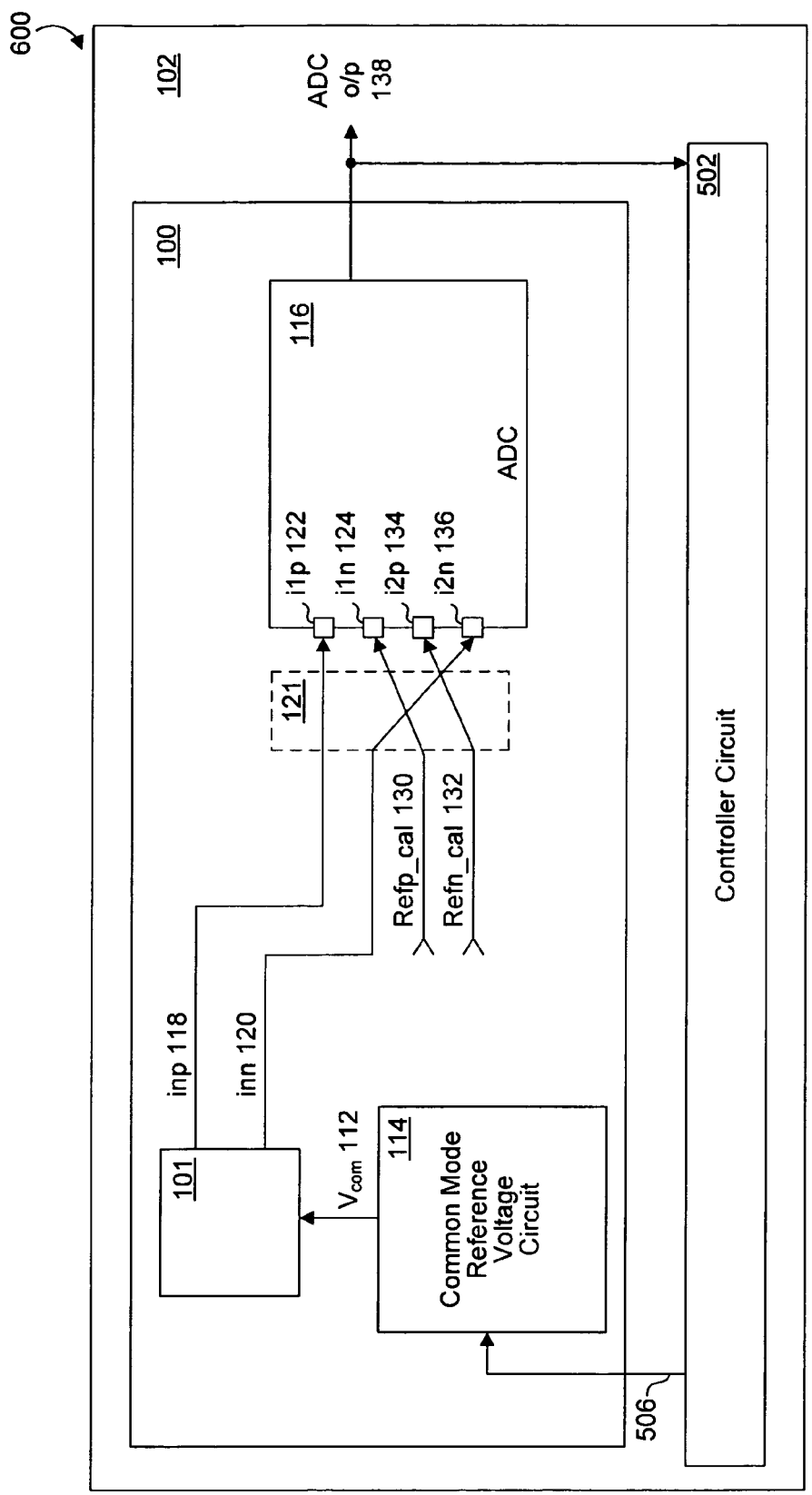
FIG. 6 illustrates an example of a converter common mode calibration circuit.

FIG. 6 illustrates an exemplary ADC common mode calibration circuit 600 having the conversion circuit 100 coupled to the feedback controller circuit 502. The controller circuit output 506 is coupled to the common mode reference voltage circuit 114. The common mode reference voltage circuit 114 is coupled to the front-end circuit 101 to provide the Vcom 112. The front-end circuit 101 is coupled to the ADC 116 via the switching circuit 121. The positive input (inp) 118 is coupled to the first ADC input node (i1p) 122. The negative input (inn) 120 is coupled to the fourth ADC input node (i2n) 136. The positive calibration input (Refp_cal) 130 is coupled to the second ADC input node (i1n) 124. The negative calibration input (Refn_cal) 132 is coupled to the third ADC input node (i2p) 134.

The ADC common mode calibration circuit 600 varies the Vcom 112 to adjust the input common mode voltage to substantially equal the calibration reference common mode voltage. The ADC common mode calibration circuit 600 may mitigate the common mode offset voltage due to the device mismatch in front-end circuit, and the common mode offset voltage due to the charge injection in the hold mode. The input common mode voltage is the average of the voltage of the positive input (inp) 118 and the voltage of the negative input (inn) 120. The reference common mode voltage is the average of the voltage of the positive calibration input (Refp_cal) 130 and the voltage of the negative calibration input (Refn_cal) 132. When the input common mode voltage is substantially equal to the reference common mode voltage, the gain of the input preamplifier of the ADC 116 is maximized.

The ADC output 138 is input to the feedback controller circuit 502. The controller circuit output 506 and the Vcom 112 are a function of the ADC output 138. The feedback controller circuit 502 provides the controller circuit output 506 to control the common mode reference voltage circuit 114. During ADC common mode calibration, the common mode reference voltage circuit 114 controls the Vcom 112. The controller circuit output 506 is disabled from the common mode reference voltage circuit 114 during ADC reference voltage calibration.

Figure 7:
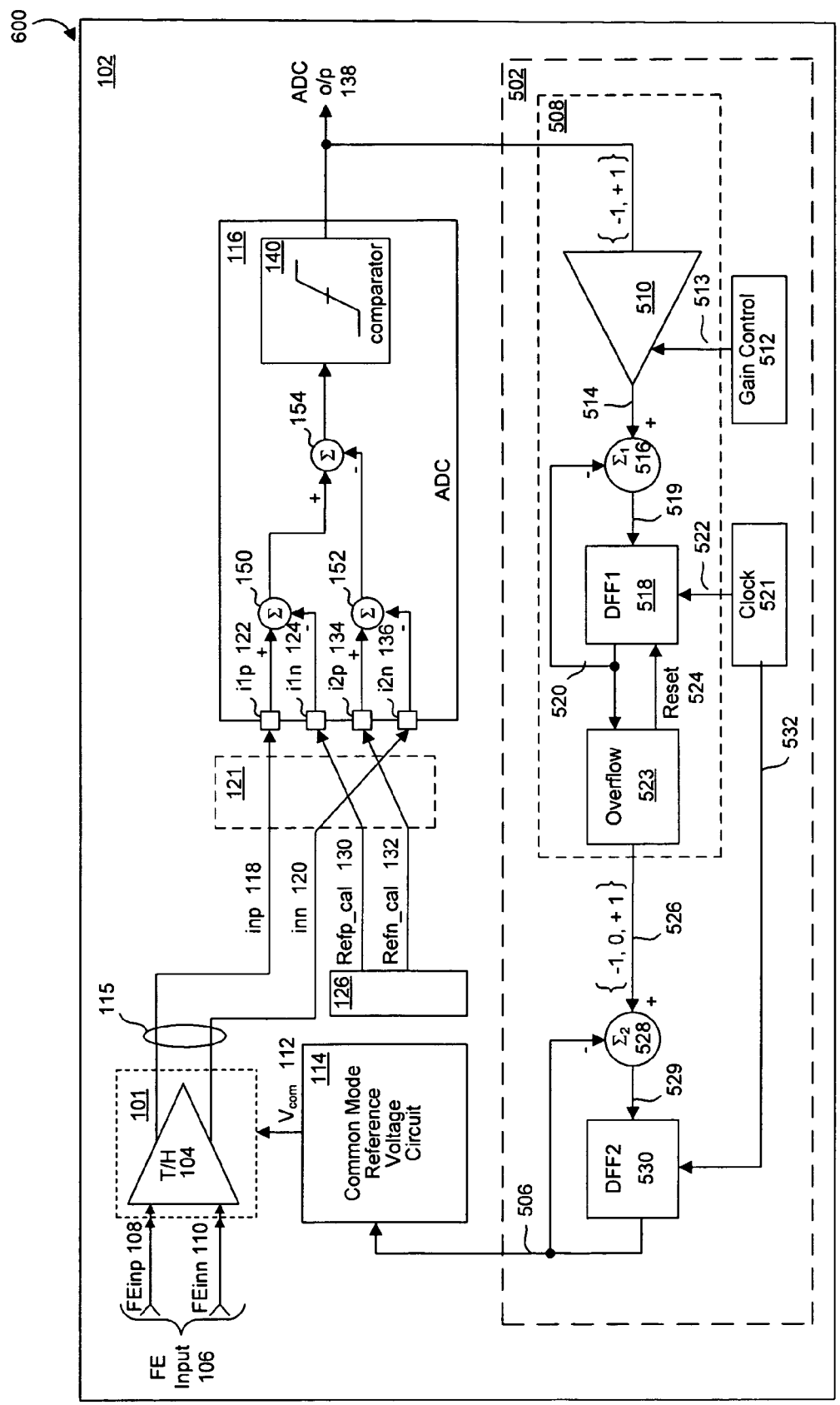
FIG. 7 illustrates an example of a converter common mode calibration circuit.

FIG. 7 illustrates the exemplary ADC common mode calibration circuit 600 having the feedback controller circuit 502 coupled to the ADC output 138 as described above. In this example, the controller circuit output 506 is coupled to the common mode reference voltage circuit 114 to control the Vcom 112. The Vcom 112 adjusts the common mode voltage of the output of the track-and-hold circuit 104 to substantially equal the calibration common mode voltage.

The controller circuit output 506 has three states. A first state of the controller circuit output 506 is the logic "high" and/or the digital "1". The first state indicates "increase" and occurs when the common mode voltage of the output of the track-and-hold circuit 104 is to be increased in voltage. A second state of the controller circuit output 506 is the logic "low" and/or the digital "−1". The second state indicates "decrease" and occurs when the common mode voltage of the output of the track-and-hold circuit 104 is to be decreased in voltage. A third state of the controller circuit output 506 is a "neutral," intermediate, and/or a digital "0" state. The third state indicates "hold" and occurs when the common mode voltage of the output of the track-and-hold circuit 104 is to be held at a substantially constant magnitude.

IX. Method for Common Mode Calibration

Figure 8:
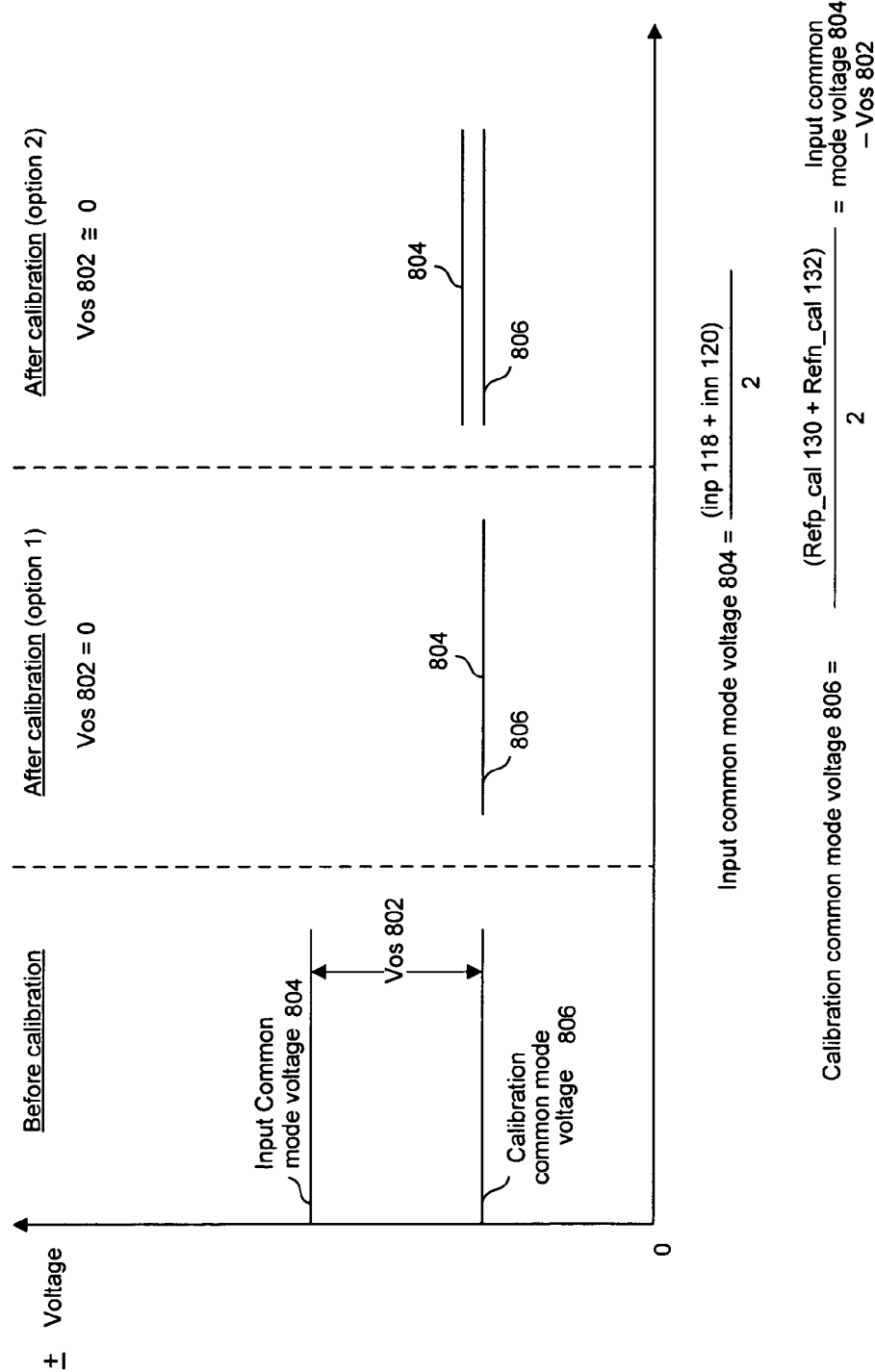
FIG. 8 illustrates exemplary changes in common mode voltage offset.

FIG. 8 illustrates a change in common mode offset voltage (Vos) 802 during common mode voltage calibration. The common mode offset voltage (Vos) 802 is the difference in voltage between an input common mode voltage 804 and a calibration common mode voltage 806. The input common mode voltage 804 is the average voltage of the positive input (inp) 118 and the negative input (inn) 120. The calibration common mode voltage 806 is the average of the positive calibration input (Refp_cal) 130 and the negative calibration input (Refn_cal) 132. Before common mode voltage calibration, the common mode offset voltage (Vos) 802 does not equal zero. After calibration, the Vos 802 equals zero volts (option 1). Alternatively, after calibration, the Vos 802 equals substantially zero volts (option 2).

FIG. 9 shows a first exemplary method for common mode calibration 900. In step 902, an analog to digital converter (ADC) input signal is compared to a calibration reference voltage to determine a common mode offset voltage, such as Vos 802. In step 904, the common mode offset voltage is minimized to calibrate the ADC input signal. The common mode offset voltage may be minimized by adjusting the Vcom 112. The common mode offset voltage is reduced to zero volts or substantially zero volts.

X. Method for Increasing ADC Input Preamplifier Gain

An exemplary method for improving the gain of the ADC preamplifier is executed during the hold phase of the track-and-hold circuit. The front-end circuit is the track-and-hold circuit in this example. First, the feedback controller circuit senses the ADC output. The feedback controller circuit adjusts the calibration voltage to reduce the calibration offset voltage. Then, the feedback controller circuit calibrates the ADC. Calibration is performed by adjusting the input common mode voltage to minimize the common mode voltage offset. Minimizing the common mode voltage offset increases the gain of the ADC preamplifier. In another example, an exemplary method for improving the gain of the ADC preamplifier is executed during the track phase of the track-and-hold circuit.

FIG. 10 shows an exemplary timing diagram 1000 for increasing ADC input preamplifier gain by calibrating an ADC input common mode voltage. The conversion circuit 100 operates in a normal mode 1004 as described in the examples of FIGS. 1 and 3, an ADC reference voltage calibration mode 1008, or an ADC common mode calibration mode 1010. The normal mode 1004 may occur during a track mode of the track-and-hold circuit 104. The ADC reference voltage calibration mode 1008 and the ADC common mode calibration mode 1010 may occur during a hold mode of the track-and-hold circuit 104.

During the normal mode 1004, the input to the comparator 140 is the reference difference subtracted from the ADC input difference. During the ADC reference voltage calibration mode 1008, the input to the comparator 140 is the calibration difference subtracted from the reference difference. In the ADC reference voltage calibration mode 1008, the positive calibration input (Refp_cal) 130 and/or the negative calibration input (Refn_cal) 132 is adjusted to minimize an ADC internal offset voltage. During the ADC common mode calibration mode 1010, the input to the comparator 140 is twice the calibration common mode subtracted from twice the input common mode. In the ADC common mode calibration mode 1010, the Vcom 112 is adjusted to minimize the common mode offset voltage.

In an example, ADC 116 operation is as follows. First, power is applied to the ADC 116. Second, reference voltage calibration is performed. Third, common mode voltage calibration is performed. Fourth, normal ADC operation ensues.

Figure 11:
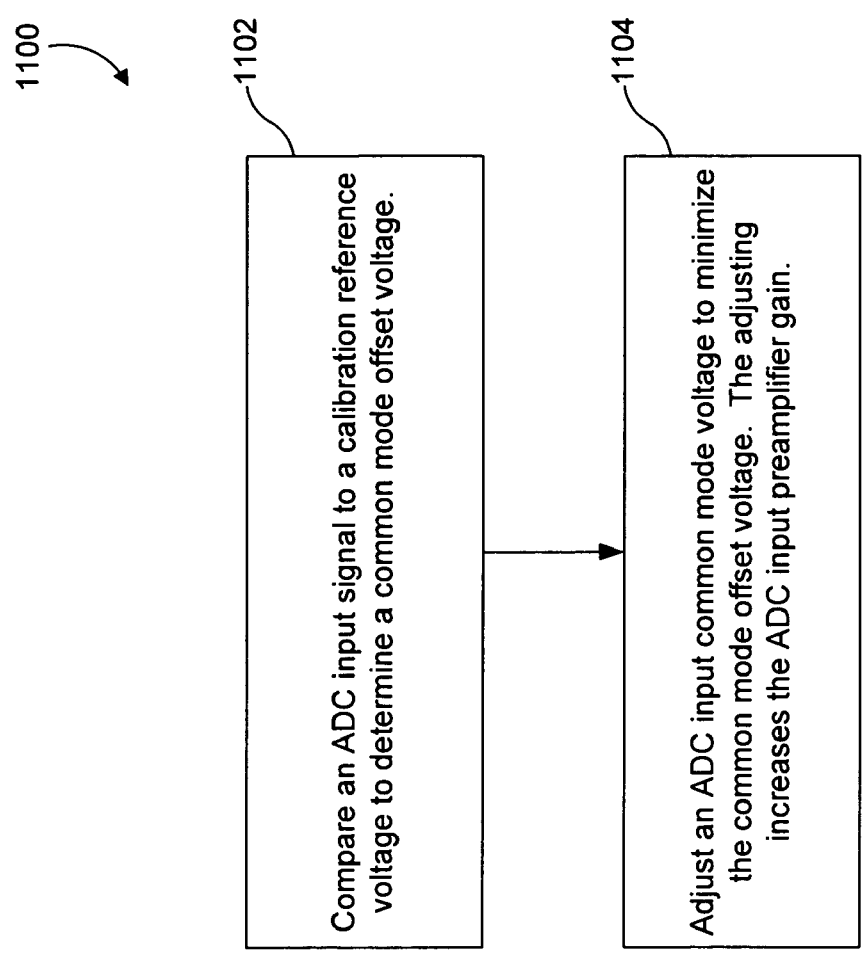
FIG. 11 illustrates another exemplary method for increasing an ADC input preamplifier gain.

FIG. 11 illustrates an exemplary method 1100 for increasing an analog-to-digital converter (ADC) input preamplifier gain in an ADC input preamplifier that is coupled to a track-and-hold circuit output. In step 1102, compare an ADC input signal to a calibration reference voltage to determine a common mode offset voltage. Adjusting the calibration common mode voltage may occur during the hold mode or the track mode of the track-and-hold circuit 104.

In step 1104, adjust an ADC input common mode voltage to minimize the common mode offset voltage. The input common mode voltage is adjusted to substantially equal the calibration common mode voltage. The adjusting increases the ADC input preamplifier gain. The ADC common mode offset voltage is reduced to zero volts or substantially zero volts. After adjusting, the input common mode voltage equals or substantially equals the calibration common mode voltage. Adjusting the input common mode voltage may occur during the hold mode or the track mode of the track-and-hold circuit 104.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A conversion circuit, comprising;
   a front-end circuit creating an analog-to-digital converter (ADC) input voltage having a input common mode voltage; and
   an ADC coupled to said front-end circuit;
   wherein a calibration voltage having a calibration common mode voltage is input to said ADC for comparison to said ADC input voltage and said front-end circuit is adjusted so said input common mode voltage substantially equals said calibration common mode voltage.

2. The conversion circuit of claim 1, wherein said front-end circuit comprises a track-and-hold circuit having a hold mode and a track mode, wherein said input common mode voltage is adjusted only during one of said hold mode or said track mode.

3. The conversion circuit of claim 1, further comprising:
   a feedback controller circuit; and
   a common mode reference voltage circuit having an output and an input, wherein said common mode reference voltage circuit input is coupled to an ADC output via said feedback controller circuit;
   wherein said common mode reference voltage circuit output is coupled to said front-end circuit.

4. The conversion circuit of claim 3, wherein said feedback controller circuit further comprises:
   an integrator having an input and an output, wherein said integrator input is coupled to said ADC output;
   a flip-flop having an input and an output, wherein said flip-flop output is coupled to said common mode reference voltage circuit input; and
   a summation circuit having an additive input coupled to said integrator output, a subtractive input coupled to said flip-flop output, and an output coupled to said flip-flop input.

5. The conversion circuit of claim 4, wherein said integrator further comprises:
   an amplifier having an input and an output, wherein said amplifier input is coupled between said ADC output and said first flip-flop input;
   a second flip-flop having an input, an output, and a reset input;
   an overflow circuit having an input coupled to said second flip-flop output, an output coupled to said summation circuit additive input, and a reset output coupled to said second flip-flop reset input; and
   a second summation circuit having an additive input coupled to said amplifier output, a subtractive input coupled to said second flip-flop output, and an output coupled to said second flip-flop input.

6. The conversion circuit of claim 3, wherein said feedback controller circuit further comprises a low pass filter.

7. The conversion circuit of claim 6, wherein said switching circuit includes a multiplexer.

8. The conversion circuit of claim 6, further comprising a calibration voltage circuit coupled to said switching circuit.

9. The conversion circuit of claim 1, further comprising a switching circuit coupled between said front-end circuit and said ADC.

10. The conversion circuit of claim 1, wherein said conversion circuit is deposited on a substrate.

11. A method for common mode calibration, comprising:
  comparing an analog-to-digital converter input signal to a reference voltage to determine a common mode offset voltage; and
  minimizing said common mode offset voltage to calibrate said analog-to-digital converter input signal.

12. The method of claim 11, wherein a track-and-hold circuit provides said analog-to-digital converter input signal and at least one of said comparing and said minimizing occurs during a hold mode of said track-and-hold circuit.

13. The method of claim 11, wherein said reference voltage is a calibration common mode voltage, said analog-to-digital converter input signal has an input common mode voltage, and said comparing determines a difference between said calibration common mode voltage and said input common mode voltage.

14. The method of claim 11, wherein said comparing is performed with an analog-to-digital converter.

15. The method of claim 11, wherein said minimizing reduces said common mode offset voltage to substantially zero volts.

16. The method of claim 11, wherein said minimizing further includes adjusting a front-end circuit.

17. The method of claim 16, wherein said adjusting further includes varying a voltage input to said front-end circuit.

18. The method of claim 11, wherein said minimizing is controlled by measuring an analog-to-digital converter output and adjusting a front-end circuit with a feedback controller circuit.

19. A method for increasing an analog to digital converter (ADC) input preamplifier gain in an ADC input preamplifier, comprising:
  comparing an ADC input signal to a calibration reference voltage to determine a common mode offset voltage; and
  adjusting an ADC input common mode voltage to minimize said common mode offset voltage,
  wherein said adjusting increases the ADC input preamplifier gain.

20. The method of claim 19, wherein at least one of said comparing and said adjusting occurs during a hold mode of the track-and-hold circuit or a track mode of the track-and-hold circuit.

21. The method of claim 19, wherein said comparing further comprises using an analog-to-digital converter to perform said comparing.

22. The method of claim 19, wherein said adjusting reduces said common mode offset voltage to substantially zero volts.

23. The method of claim 19, wherein said adjusting includes using a variable front-end circuit.

24. The method of claim 23, wherein said adjusting further includes varying a voltage input to said front-end circuit.

25. The method of claim 19, wherein said adjusting includes measuring an analog-to-digital converter output and varying a front-end circuit with a feedback controller circuit.

* * * * *